United States Patent
Harvey et al.

(10) Patent No.: US 11,622,437 B2
(45) Date of Patent: *Apr. 4, 2023

(54) SPOTLIGHT

(71) Applicant: MILWAUKEE ELECTRIC TOOL CORPORATION, Brookfield, WI (US)

(72) Inventors: Kyle Harvey, Wauwatosa, WI (US); Alan Amundson, Milwaukee, WI (US); Ross McIntyre, Milwaukee, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 18 days.

This patent is subject to a terminal disclaimer.

(21) Appl. No.: 17/217,562

(22) Filed: Mar. 30, 2021

(65) Prior Publication Data
US 2021/0219403 A1 Jul. 15, 2021

Related U.S. Application Data

(63) Continuation of application No. 16/894,230, filed on Jun. 5, 2020, now Pat. No. 10,966,303, which is a
(Continued)

(51) Int. Cl.
*H05B 47/19* (2020.01)
*H05B 47/11* (2020.01)
(Continued)

(52) U.S. Cl.
CPC .......... *H05B 47/19* (2020.01); *F21V 14/003* (2013.01); *F21V 14/006* (2013.01); *H05B 45/10* (2020.01);
(Continued)

(58) Field of Classification Search
None
See application file for complete search history.

(56) References Cited

U.S. PATENT DOCUMENTS 7,202,613 B2 * 4/2007 Morgan ................. H05B 45/20
315/312
7,358,679 B2 * 4/2008 Lys ....................... F21V 23/003
315/DIG. 4
(Continued)

FOREIGN PATENT DOCUMENTS

CN 101675290 A 3/2010
CN 103430627 A 12/2013
(Continued)

OTHER PUBLICATIONS

Extended European Search Report for Application No. 16187003.5 dated Jan. 31, 2017 (7 pages).
(Continued)

*Primary Examiner* — Srinivas Sathiraju
(74) *Attorney, Agent, or Firm* — Michael Best & Friedrich LLP (57) ABSTRACT

A spotlight and a method of controlling the spotlight with an external device. The spotlight having a first light source including a center spotlight, a second light source including area lights, a power supply, a transceiver configured to communicate wirelessly with the external device, and a processor. The processor is operable to receive a first input from the external device specifying a first amount of power to be provided to the first light source, and receive a second input from the external device specifying a second amount of power to be provided to the second light source. The processor is also operable to control the power supply to provide the first amount of power to the first light source in response to the first input, and control the power supply to provide the second amount of power to the second light source in response to the second input.

20 Claims, 14 Drawing Sheets

Related U.S. Application Data continuation of application No. 16/400,190, filed on May 1, 2019, now Pat. No. 10,681,790, which is a continuation of application No. 16/056,609, filed on Aug. 7, 2018, now Pat. No. 10,314,141, which is a continuation of application No. 15/633,957, filed on Jun. 27, 2017, now Pat. No. 10,070,500, which is a continuation of application No. 15/254,248, filed on Sep. 1, 2016, now Pat. No. 9,699,865.

(60) Provisional application No. 62/237,776, filed on Oct. 6, 2015, provisional application No. 62/214,172, filed on Sep. 3, 2015.

(51) Int. Cl.

| | | |
|---|---|---|
| *H05B 45/34* | (2020.01) | |
| *H05B 45/345* | (2020.01) | |
| *H05B 47/115* | (2020.01) | |
| *H05B 45/12* | (2020.01) | |
| *H05B 45/10* | (2020.01) | |
| *H05B 47/105* | (2020.01) | |
| *F21V 14/00* | (2018.01) | |
| *F21Y 115/10* | (2016.01) | |

(52) U.S. Cl.
CPC ............ *H05B 45/12* (2020.01); *H05B 45/34* (2020.01); *H05B 45/345* (2020.01); *H05B 47/105* (2020.01); *H05B 47/11* (2020.01); *H05B 47/115* (2020.01); *F21Y 2115/10* (2016.08)

(56) References Cited

U.S. PATENT DOCUMENTS

| | | | | |
|---|---|---|---|---|
| 7,358,929 | B2 * | 4/2008 | Mueller | H05B 47/155 345/1.3 |
| 7,461,948 | B2 | 12/2008 | van Voorst Vader et al. | |
| 7,646,029 | B2 * | 1/2010 | Mueller | F21S 45/42 438/237 |
| 7,888,883 | B2 | 2/2011 | Crawford et al. | |
| 8,033,686 | B2 | 10/2011 | Recker et al. | |
| 8,080,819 | B2 * | 12/2011 | Mueller | H05B 45/3725 257/E25.032 |
| 8,274,226 | B1 | 9/2012 | Sikora et al. | |
| 8,324,836 | B2 | 12/2012 | Crawford et al. | |
| 8,686,644 | B2 * | 4/2014 | Wootton | H05B 45/22 315/117 |
| 8,944,276 | B2 | 2/2015 | Garagiola | |
| 8,994,276 | B2 | 3/2015 | Recker et al. | |
| 9,392,669 | B2 | 7/2016 | Recker et al. | |
| 9,544,767 | B2 | 1/2017 | Parvathaneni | |
| 9,544,967 | B2 | 1/2017 | Recker et al. | |
| 9,562,672 | B2 | 2/2017 | Jorgensen et al. | |
| 9,699,865 | B2 * | 7/2017 | Harvey | H05B 47/105 |
| 9,839,083 | B2 * | 12/2017 | van de Ven | H05B 45/20 |
| 9,955,551 | B2 * | 4/2018 | Spero | F21K 9/23 |
| 9,995,463 | B2 | 6/2018 | Kjeldsen et al. | |
| 10,070,500 | B2 * | 9/2018 | Harvey | H05B 45/10 |
| 10,314,141 | B2 * | 6/2019 | Harvey | H05B 45/345 |
| 10,467,670 | B2 * | 11/2019 | Seuntiens | G06Q 30/0621 |
| 10,624,186 | B2 * | 4/2020 | Heemstra | G02B 5/0231 |
| 10,670,224 | B1 * | 6/2020 | Lin | F21V 14/04 |
| 10,681,790 | B2 * | 6/2020 | Harvey | H05B 47/11 |
| 10,894,503 | B2 * | 1/2021 | Spero | H05B 47/115 |
| 11,131,431 | B2 * | 9/2021 | Jiang | F21V 31/005 |
| 11,369,705 | B2 * | 6/2022 | Andersson | A61L 9/20 |
| 2003/0193842 | A1 * | 10/2003 | Harrison | G04C 17/00 368/82 |
| 2004/0160199 | A1 * | 8/2004 | Morgan | G09G 3/14 315/312 |
| 2005/0116667 | A1 * | 6/2005 | Mueller | E04F 15/02 315/312 |
| 2005/0174473 | A1 * | 8/2005 | Morgan | H05B 45/355 348/370 |
| 2005/0253533 | A1 * | 11/2005 | Lys | F21V 23/003 315/291 |
| 2006/0022214 | A1 * | 2/2006 | Morgan | H05B 45/50 257/E25.032 |
| 2010/0171145 | A1 * | 7/2010 | Morgan | H05K 1/0306 257/E33.056 |
| 2011/0249438 | A1 | 10/2011 | Han et al. | |
| 2012/0013238 | A1 | 1/2012 | Jonsson | |
| 2012/0206050 | A1 * | 8/2012 | Spero | B60Q 1/1423 315/152 |
| 2014/0183946 | A1 | 7/2014 | Recker et al. | |
| 2014/0301071 | A1 | 10/2014 | Jorgensen et al. | |
| 2015/0035440 | A1 * | 2/2015 | Spero | B60Q 1/1423 315/153 |
| 2015/0084513 | A1 | 3/2015 | Anthony et al. | |
| 2016/0035217 | A1 * | 2/2016 | Camden | G05B 15/02 340/12.5 |
| 2016/0169454 | A1 * | 6/2016 | Moon | H05B 45/12 362/221 |
| 2017/0102493 | A1 * | 4/2017 | Shivell | G02B 6/006 |
| 2017/0332457 | A1 * | 11/2017 | Harvey | H05B 45/34 |
| 2018/0255622 | A1 * | 9/2018 | Spero | H05B 3/008 |
| 2018/0343723 | A1 * | 11/2018 | Harvey | H05B 47/11 |
| 2019/0230767 | A1 * | 7/2019 | Heemstra | H05B 47/115 |
| 2019/0261490 | A1 * | 8/2019 | Harvey | H05B 47/115 |
| 2020/0200359 | A1 * | 6/2020 | Lin | F21V 14/04 |
| 2020/0236750 | A1 * | 7/2020 | Gao | H01L 33/50 |
| 2020/0240594 | A1 * | 7/2020 | Jiang | F21K 9/278 |
| 2020/0292138 | A1 * | 9/2020 | Crayford | F21K 9/235 |
| 2020/0305257 | A1 * | 9/2020 | Harvey | F21V 14/006 |
| 2021/0162912 | A1 * | 6/2021 | Spero | H05B 45/395 |

FOREIGN PATENT DOCUMENTS

| | | | |
|---|---|---|---|
| CN | 105830537 A | 8/2016 | |
| EP | 3139709 A1 * | 3/2017 | ............ F21V 14/003 |
| WO | 2014047621 A1 | 3/2014 | |
| WO | 2015006478 A1 | 1/2015 | |
| WO | 2015071816 A2 | 5/2015 | |

OTHER PUBLICATIONS

European Patent Office Action for Application No. 16187003.5 dated Dec. 13, 2017 (4 pages).
English Translation of the Chinese Patent Office Action for Application No. 201610802663.4 dated Oct. 31, 2017 (13 pages).

\* cited by examiner

SPOTLIGHT

CROSS-REFERENCE TO RELATED APPLICATIONS

This application is a continuation of U.S. patent application Ser. No. 16/894,230, filed Jun. 5, 2021, now U.S. Pat. No. 10,966,303, which is a continuation of U.S. patent application Ser. No. 16/400,190, filed May 1, 2019, now U.S. Pat. No. 10,681,790, which is a continuation of U.S. patent application Ser. No. 16/056,609, filed Aug. 7, 2018, now U.S. Pat. No. 10,314,141, which is a continuation of U.S. patent application Ser. No. 15/633,957, filed Jun. 27, 2017, now U.S. Pat. No. 10,070,500, which is a continuation of U.S. patent application Ser. No. 15/254,248, filed Sep. 1, 2016, now U.S. Pat. No. 9,699,865, which claims priority to U.S. Provisional Application No. 62/214,172, filed Sep. 3, 2015, and to U.S. Provisional Application No. 62/237,776, filed Oct. 6, 2015, the entire contents of all of which are incorporated by reference herein.

BACKGROUND

The present invention relates to lights, such as spotlights, floodlights, or flashlights.

SUMMARY

One embodiment provides a spotlight configured to be controlled by an external device. The spotlight includes a first light source and a second light source and a power supply providing power to the first light source and the second light source. The spotlight also includes a transceiver configured to communicate wirelessly with the external device and a processor electrically coupled to the first light source, the second light source, the power supply, and the transceiver. The processor is operable to receive a first input from the external device specifying a first amount of power to be provided to the first light source and receive a second input from the external device specifying a second amount of power to be provided to the second light source. The processor is also operable to control the power supply to provide the first amount of power to the first light source in response to the first input and control the power supply to provide the second amount of power to the second light source in response to the second input.

Another embodiment provides a method of controlling a spotlight having a first light source, a second light source, and a power supply. The method includes receiving a first input from an external device specifying a first amount of power to be provided to the first light source and receiving a second input from the external device specifying a second amount of power to be provided to the second light source. The method also includes controlling, via a processor of the spotlight, the power supply to provide the first amount of power to the first light source in response to the first input and controlling, via the processor, the power supply to provide the second amount of power to the second light source in response to the second input.

In one embodiment, the invention provides a light including a processor, a first light source, and a second light source. The first light source includes a center spotlight. The second light source includes area lights. The processor is operable to allow independent operation of the first light source and the second light source.

In some embodiments, the light also includes a film that, upon application of a current, changes in opacity.

In some embodiments, the light further includes an ambient light sensor to adjust the intensity of the first and second light sources based on the sensed ambient light.

In some embodiments, the light also includes a distance sensor to adjust the intensity of the first and second light sources based on the detected distance from an object.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
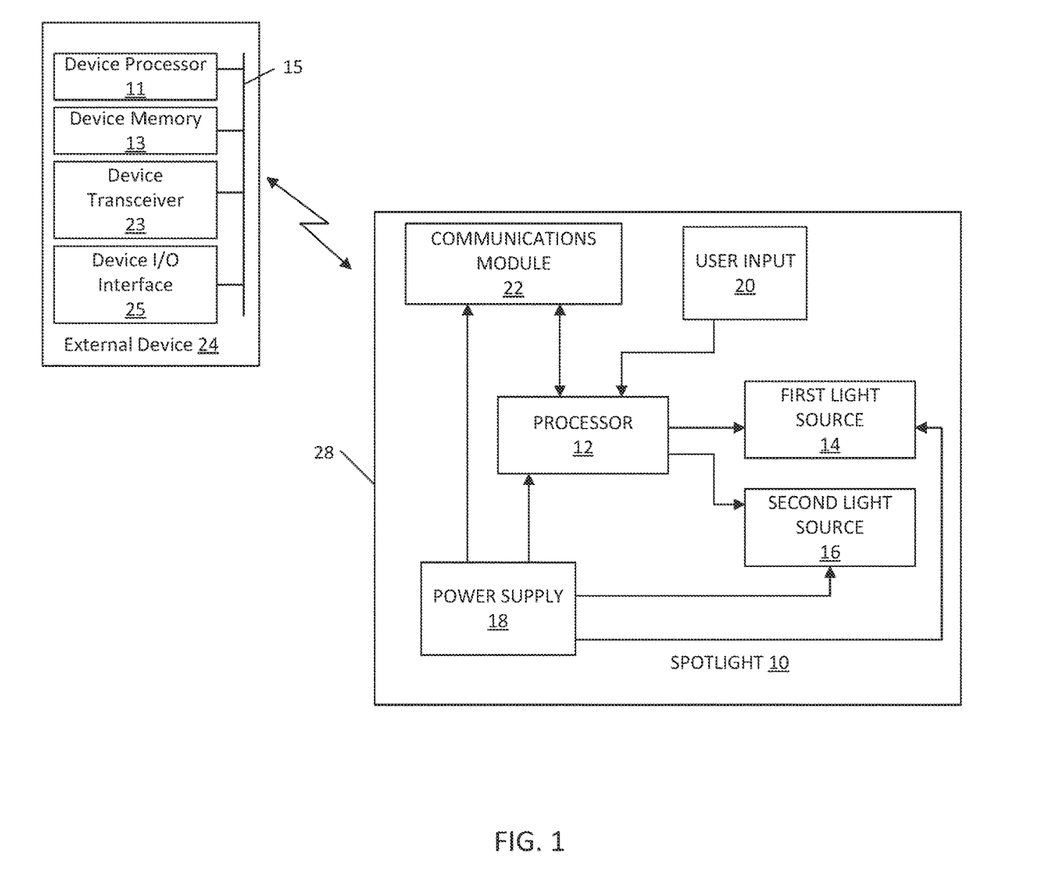
FIG. 1 is a schematic of a spotlight and an external device embodying the invention.

FIG. 1 illustrates a spotlight, floodlight, or flashlight 10 according to an embodiment of the invention. As shown, the spotlight 10 includes a processor 12 coupled to a first light source 14 and to a second light source 16. The processor 12 is configured to control a power supply 18 to supply power to the first light source 14 and the second light source 16. A user input 20, such as a first variable switch and a second variable switch, is coupled to processor 12 to allow a user to modify the amount of power supplied to the first light source 14 and second light source 16. In addition, the communications module 22 is coupled to the processor 12 to allow an external device 24, via wireless communications, to supply an alternate input for controlling the amount of power supplied to the first light source 14 and the second light source 16. The external device 24 may be, for example, a portable electronic device or computing device such as a smart phone, tablet, laptop, or the like.

As shown in FIG. 1, the spotlight 10 includes a housing 28 that supports the first light source 14 and the second light source 16. The housing 28 also supports and at least partially encloses the processor 12, the power supply 18, the communications module 22, and other components of the spotlight 10. The spotlight 10, therefore, is a self-contained unit that is separate from the external device 24.

The first light source 14 and the second light source 16 may be, for example, incandescent light bulbs, halogen lights, light emitting diodes (LED), or the like, or a combination thereof. In some embodiments, the power supply 18 may be connected to the first light source 14 and the second light source 16 through the processor 12. In some embodiments, the power supply 18 may be connected to the first light source 14 and the second light source 16 through a switch bridge or a light driver (for example, an LED driver). The switch bridge may be controlled by the processor 12 to provide a specific amount of power to the first light source 14 and the second light source 16.

The power supply 18 may be, for example, a Lithium-ion battery pack, a nickel cadmium battery pack, or the like. In some embodiments, the processor 12 is implemented as a microprocessor with separate memory (not shown). In other embodiments, the processor12 may be implemented as a microcontroller (with memory on the same chip). The processor 12 may be implemented partially or entirely as, for example, a field-programmable gate array (FPGA), and application specific integrated circuit (ASIC). The communications module 22 may be, for example, a transceiver that enables wireless communication between the spotlight 10 and the external device 24. In other embodiments, rather than a transceiver, the communications module 22 may be implemented to include separate transmitting and receiving components, for example, a transmitter and a receiver. The communications module 22 may be, for example, a Bluetooth® chip, a Wi-Fi™ chip, or the like.

In some embodiments, the variable switches of the user input 20 may be, for example, on-off buttons, trigger switches, knobs, and the like. The variable switches may be located on the housing 28 of the spotlight 10 and may be operated by a user to specify the amount of power to be supplied to the first light source 14 and the second light source 16. FIG. 1 illustrates only one exemplary embodiment of a spotlight 10. In other embodiments, the spotlight 10 may include more or fewer components and may perform functions that are not explicitly described herein.

The external device 24 includes a device processor 11, a device memory 13, a device transceiver 23, and a device input/output interface 25. The device processor 11, the device memory 13, the device transceiver 23, and the device input/output interface 25 may communicate over one or more control and/or data buses (for example, a device communication bus 15). FIG. 1 illustrates only one exemplary embodiment of the external device 24. The external device 24 may include more or fewer components than illustrated and may perform additional functions other than those described herein.

The device processor 11 may be implemented in various ways including ways that are similar to those described above with respect to the processor 12. In the example illustrated, the device memory 13 includes non-transitory, computer-readable memory that stores instructions that are received and executed by the device processor 11 to carry out the functionality of the external device 24. The device memory 13 may include, for example, a program storage area and a data storage area. The program storage area and the data storage area may include combinations of different types of memory, such as read-only memory and random-access memory.

The device transceiver 23 enables wireless communication between the external device 24 and the spotlight 10. In other embodiments, rather than a device transceiver 23, the external device 24 may include separate transmitting and receiving components, for example, a transmitter and a receiver. The device input/output interface 25 may include one or more input mechanisms (for example, a touch screen, a keypad, a button, a knob, and the like), one or more output mechanisms (for example, a display, a speaker, and the like), or a combination thereof.

Figure 2:
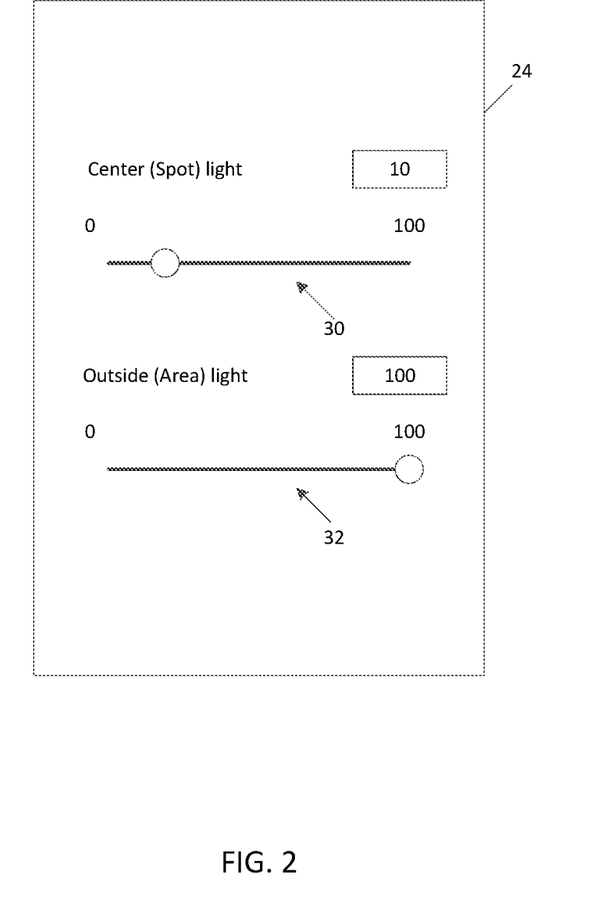
FIGS. 2-4 are schematics of the spotlight and the external device operating in a first condition.
Figure 3:
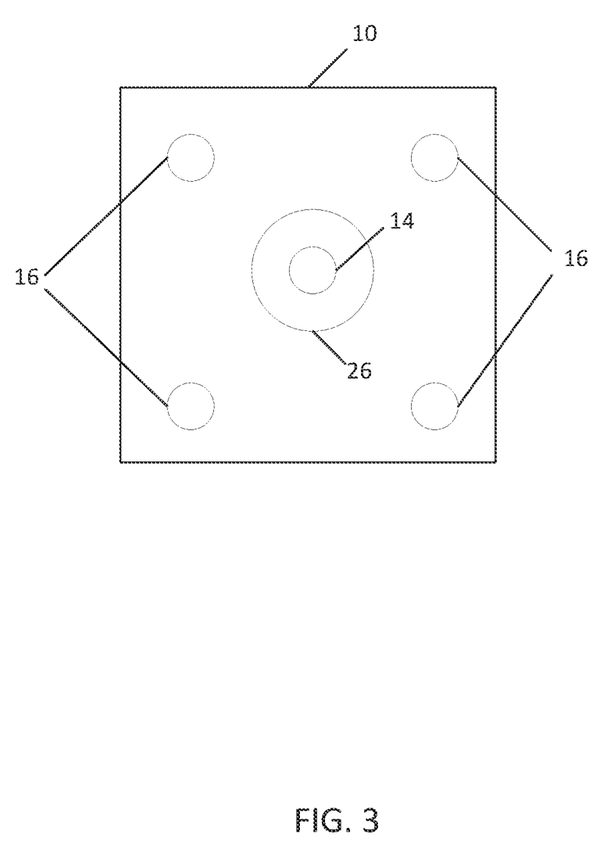
Figure 4:
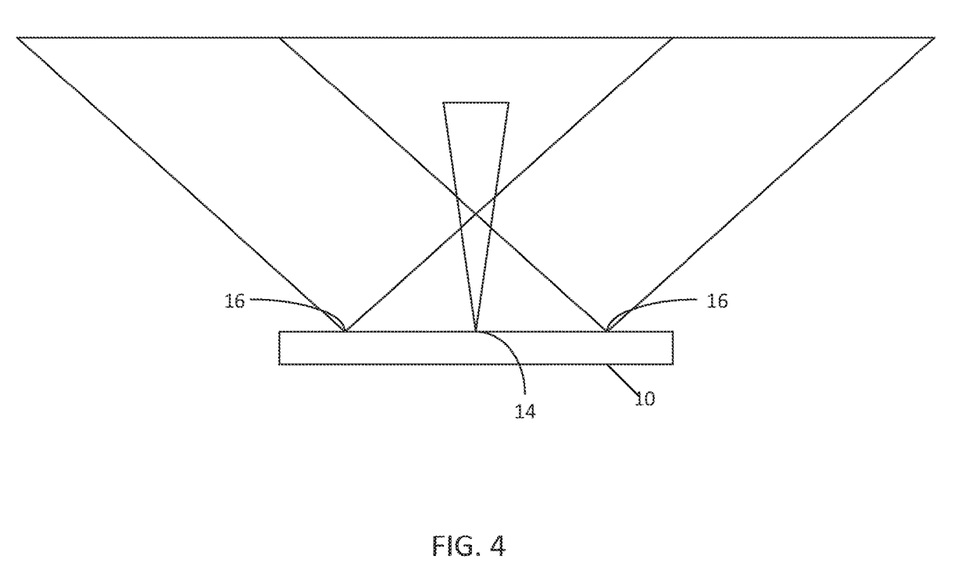

FIGS. 2-4 illustrate an example of using the external device 24 to control the amount of power supplied to the first light source 14 and second light source 16. As shown in FIG. 2, a screen presented to the user on the device input/output interface 25 of the external device 24 allows the user to modify a percentage of power supplied to the first group of lights (for example, the first light source 14), such as a center spotlight configured to cast a narrow beam via an optical lens 26, and to modify a percentage of power supplied to the second group of lights (for example, the second light source 16), such as area lights configured to cast a broad coverage beam. FIG. 3 illustrates an example arrangement of the first light source 14 and the second light source 16 on the spotlight 10 housing 28. The first light source 14 is a center spotlight arranged at the center of a light-emitting surface of the housing 28. The second light source 16 is a group of lights arranged at or close to the periphery of the light-emitting surface of the housing 28 and around the first light source 14. Other embodiments may have different arrangements of the first light source 14 and the second light source 16.

As described above, a switch bridge may be controlled by the processor 12 to provide a specific amount of power to the first light source 14 and the second light source 16. For example, the switch bridge may be a constant current driver where the voltage received from the power supply 18 may be constant, but the current may vary depending on the selected brightness. In such embodiments, the current supplied by the switch bridge may be constant, but a voltage regulator may vary the voltage provided to the first light source 14 or the second light source 16 to vary the brightness. In other embodiments, the switch bridge may be a constant voltage driver where the current provided to the first light source 14 and the second light source 16 is varied, but the voltage provided to the first light source 14 and the second light source 16 is kept constant (although this voltage may not be the same as the voltage supplied by the power supply 18).

In the example illustrated in FIG. 2, the user interface includes two slider bars 30 and 32 for receiving an input (for example, first input at slider bar 30 and second input at slider bar 32) from a user. The slider bars 30 and 32 may correspond to a brightness level of the first light source 14 and the second light source 16, respectively. The user can set the percentage of power for the separate light groups between 0% and 100% as desired, where 100% corresponds to the maximum amount of power that can be delivered to the first light source 14 or the second light source 16. As shown in FIGS. 2-4, the center spotlight is set to 10, and the area lights are set to 100. As such, a beam pattern is created for broader, general area lighting, as shown in FIG. 4. The slider bars 30 and 32 illustrated in FIG. 2 may be used to map to a light intensity. That is, the slider bars 30 and 32 can map the first input and the second input to a percentage of maximum amount of power capable of being provided to the first light source 14 or the second light source 16. For example, at "100" brightness, 100% of the power (voltage or current) may be provided to the first light source 14 or second light source 16. Similarly, at "50" brightness, 50% of the power may be provided to the first light source 14 or the second light source 16. The actual amount of current or voltage provided may depend on the requirements of the type of light source used.

Figure 5:
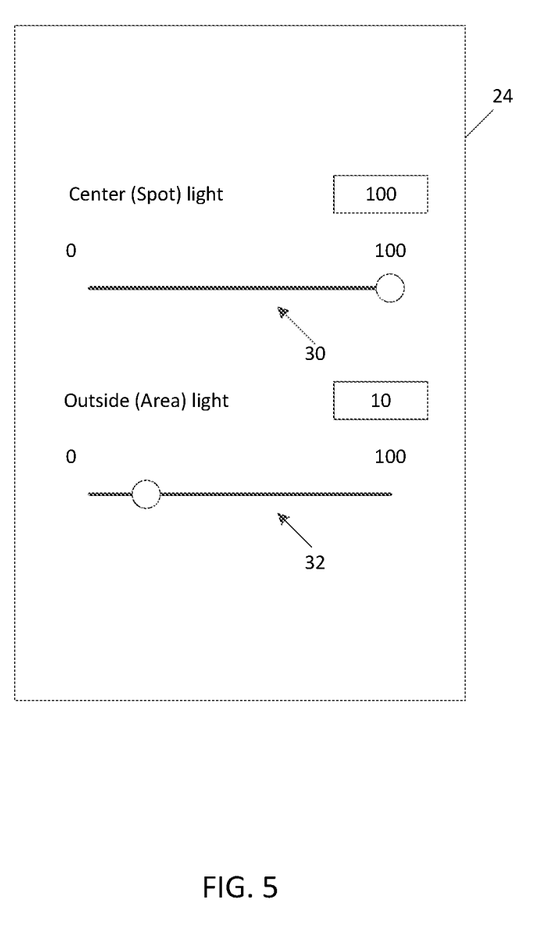
FIGS. 5-7 are schematics of the spotlight and the external device operating in a second condition.
Figure 6:
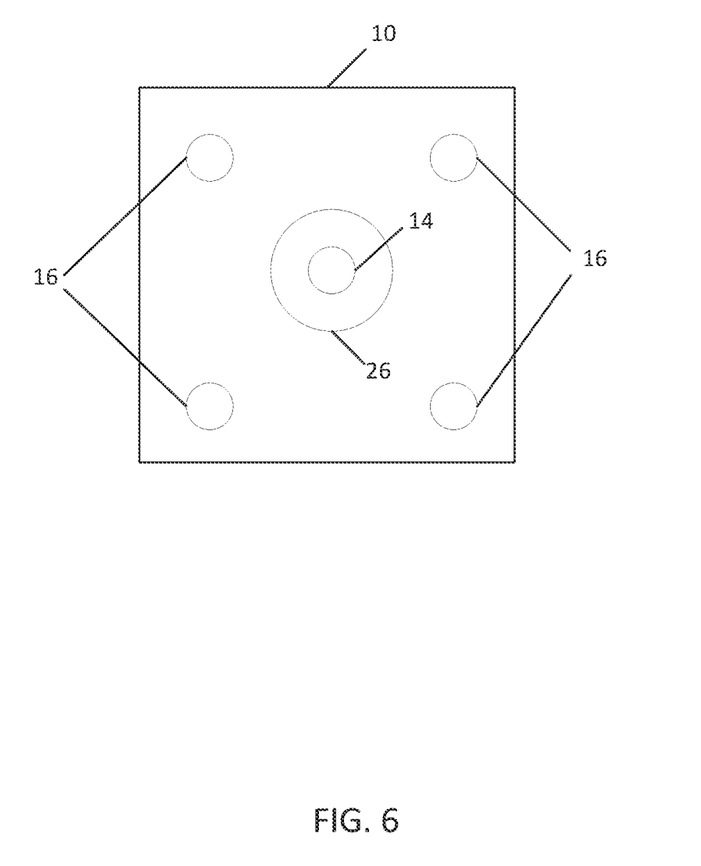
Figure 7:
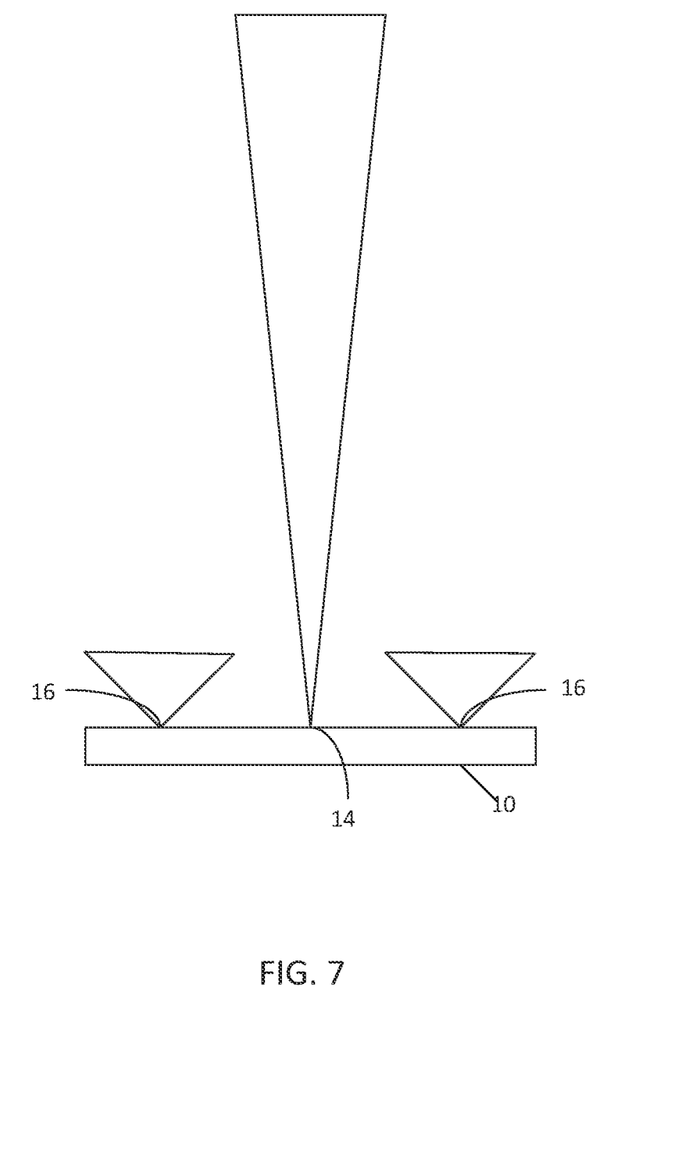

As shown in FIGS. 5-7, a beam pattern for a long-throw spotlight is created. As shown, the center spotlight is set to "100," and the area lights are set to "10."

Figure 8:
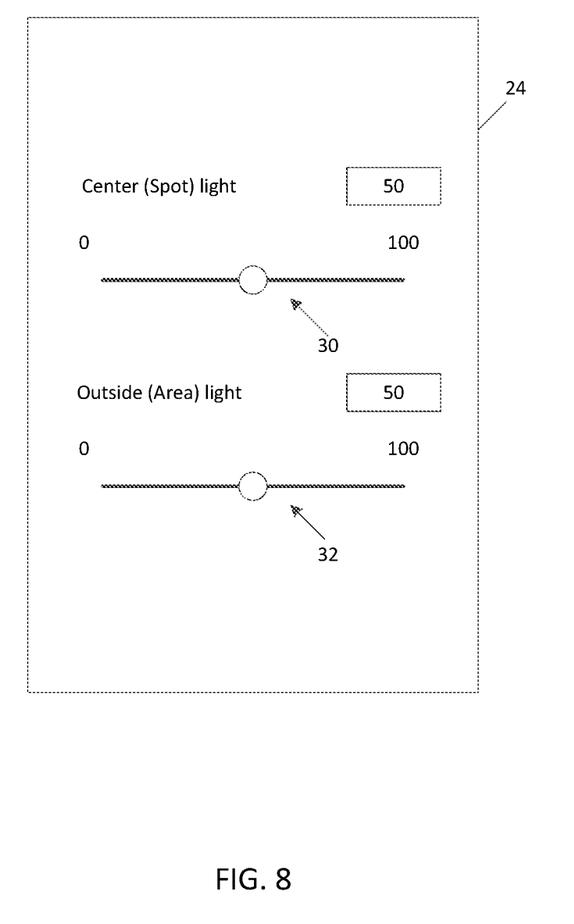
FIGS. 8-10 are schematics of the spotlight and the external device operating in a third condition.
Figure 9:
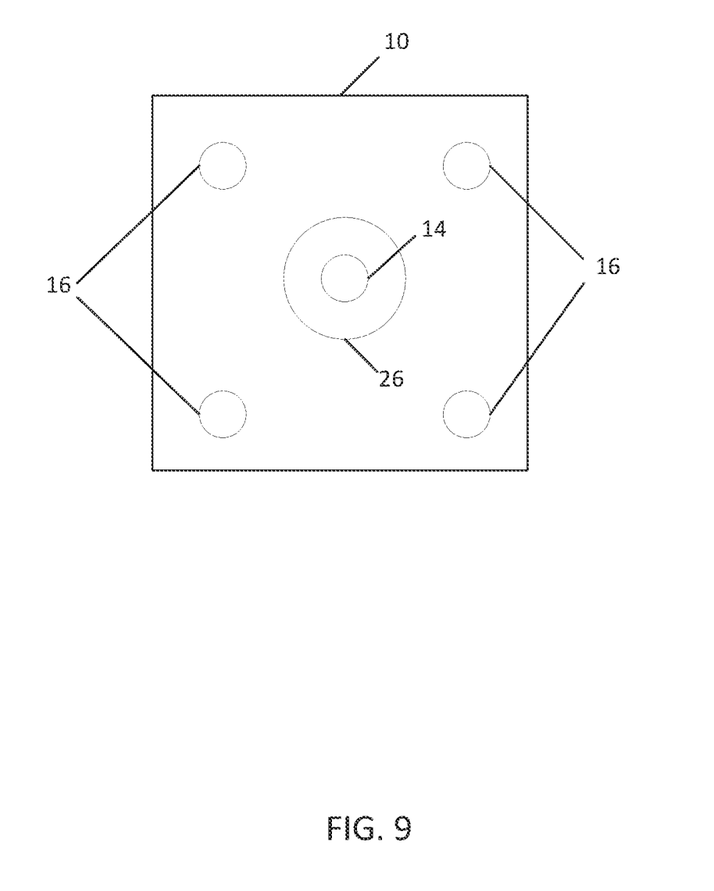
Figure 10:
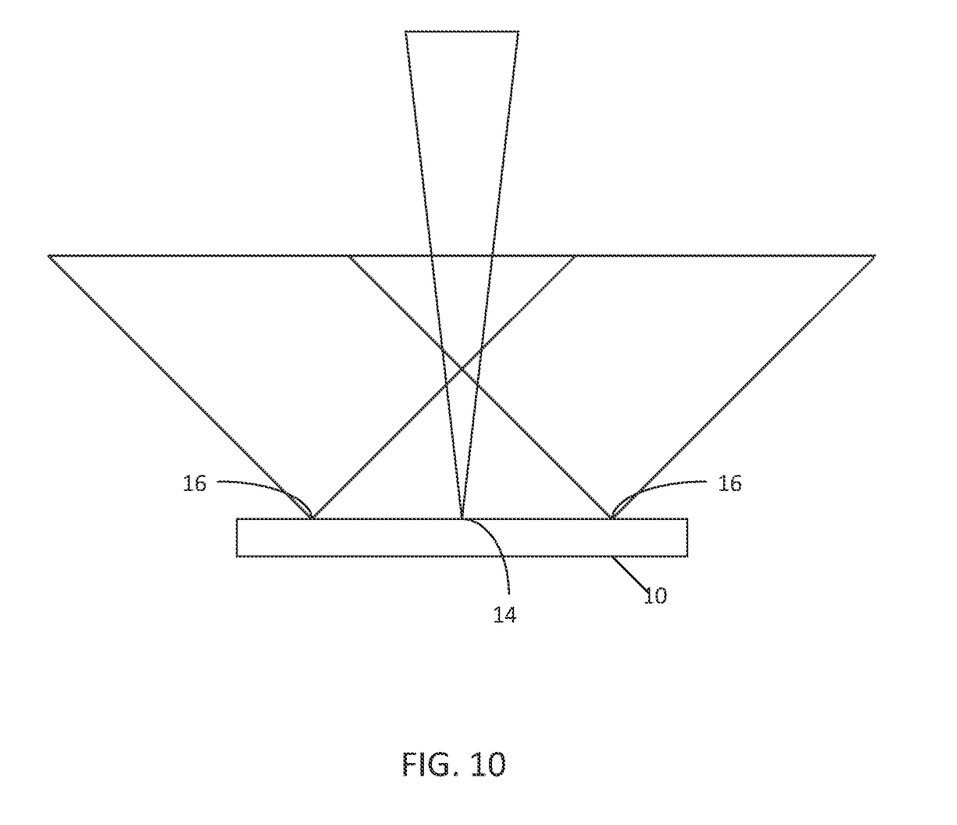

FIGS. 8-10 illustrate a beam pattern where the center and area lights are set to a 50% power level.

After the brightness of the light sources 14 and 16 is set using the slider bars 30 and 32, the variable switches of the user input 20 (FIG. 1) may be used to make adjustments to the brightness. For example, the first variable switch is coupled to the processor 12 to adjust the input to the first light source 14, and the second variable switch is coupled to the processor 14 to adjust the input to the second light source 16. The variable switches 14 and 16 allow a user to make quick adjustments to the intensity of the light sources 14 and 16 directly at the spotlight 10, without having to use the external device 24.

Figure 11:
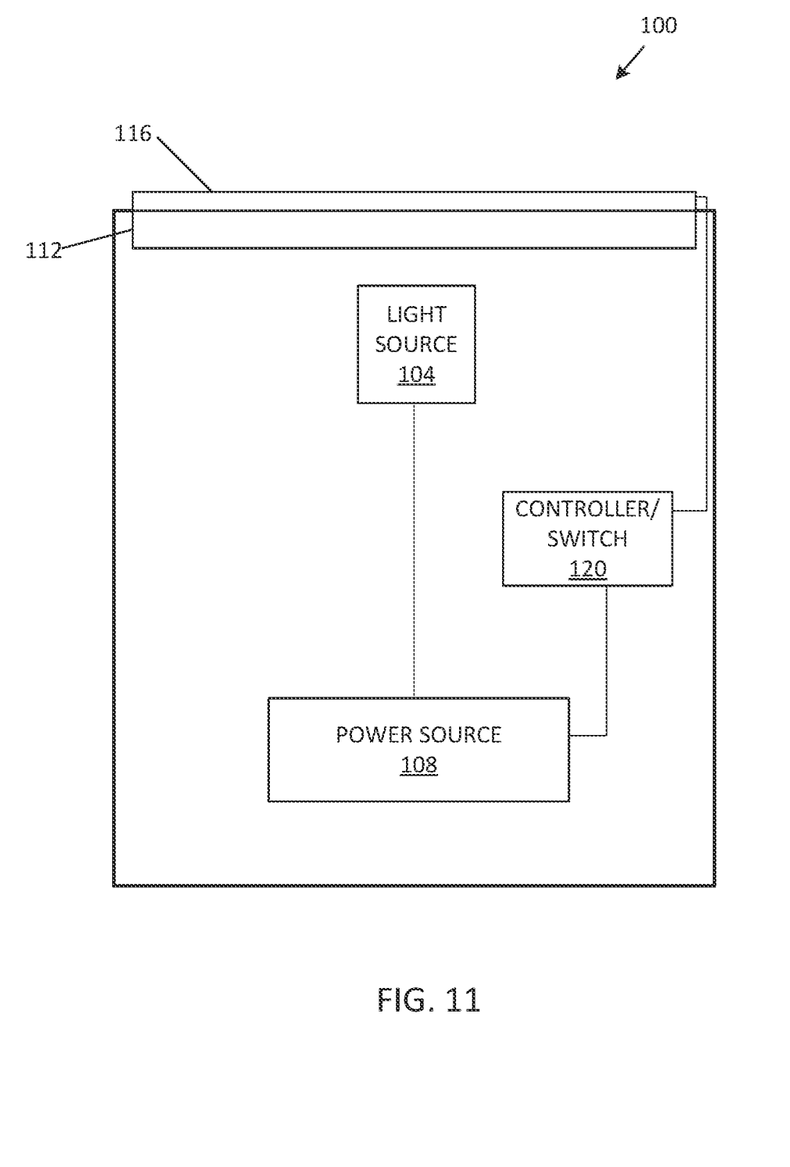
FIG. 11 is a schematic of another spotlight embodying the invention.

FIG. 11 illustrates another spotlight, floodlight, or flashlight 100. The spotlight 100 includes a light source 104, a power supply 108, and a lens 112. The illustrated spotlight 100 also includes a film 116 applied to the lens 112. The film 116 may be, for example, a smart film sold by Sonte. The film 116 is coupled to the power supply 108 through a processor (for example, processor 12) or switch 120. That is, the film 116 may include one or more electrodes connected to an output of a processor of the spotlight 100, which in turn in connected to the power supply 108. In a first state (i.e., when no current is applied to the film 116), the film 116 is clear or transparent. In a second state (i.e., upon application of a current to the film 116), the opacity of the film 116 changes (e.g., increases). In the second state, the film 116 tends to diffuse the light from the light source 104 to provide a diffuse light. In some embodiments, the film 116 may be electronically actuated to act as a lens and change the light source 104 between spot or flood modes depending on the amount of current provided. In other embodiments, the film 116 may be used to dim the light source 104 by decreasing the transparency/translucency or changing the color of the film in response to changes in current provided. Thus, only a single spot LED may be needed to provide both spot lighting and area lighting. However, in some embodiments, the film 116 may be used in combination with the spotlight 10 of FIG. 1. In these embodiments, the amount of current applied to the film 116 may be controlled by the processor 12.

Similar to the center spotlights and area lights discussed above, the current applied to the film 116 may be controlled by an external device 24. In some embodiments, the amount of current applied to the film 116 (and thus the opacity of the film 116) can be varied to provide varying amounts of spot and area lighting based on the input from the external device 24. The external device 24 may display a third slider bar (similar to the first slider bar 30 or second slider bar 32) to receive an input (for example, a third input) from the user. This input from the user may be mapped to the current provided to the film 116. The input may be mapped as described above with respect to slider bars 30 and 32.

In some embodiments, the film 116 is applied to the entire lens 112 of the spotlight 100. In other embodiments, the film 116 may only be applied to portions or sections of the lens 112 to create different lighting patterns.

Figure 12:
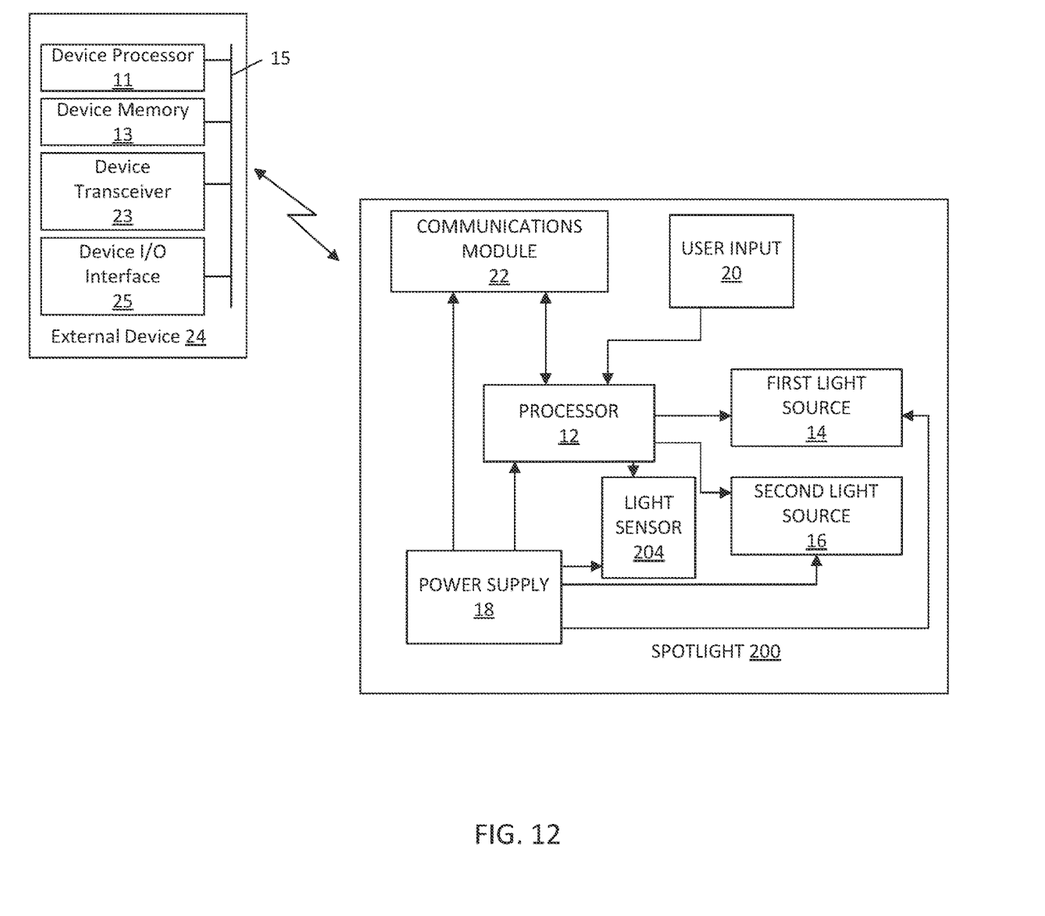
FIG. 12 is a schematic of yet another spotlight and an external device embodying the invention.

FIG. 12 illustrates a spotlight, floodlight, or flashlight 200 according to another embodiment of the invention. The spotlight 200 is similar to the spotlight 10 discussed above; however, the illustrated spotlight 200 also includes an ambient light sensor 204. The ambient light sensor 204 is coupled to the processor 12 and senses ambient light from the surrounding environment. In operation, the processor 12 can adjust the intensity of either or both of the first light source 14 and the second light source 16 based on the ambient light sensed by the ambient light sensor 204. Additionally or alternatively, the processor 12 can adjust the distribution between the first light source 14 and the second light source 16 based on the ambient light sensed by the ambient light sensor 204. For example, the ambient light sensor 204 may provide an input to the processor 12 indicating the amount of ambient light sensed. The processor 12 may be pre-configured to convert the input received from the ambient light sensor 204 to an output power of the first light source 14 and the second light source 16. The processor 12 may convert the ambient light sensed to a power output using, for example, a look-up table stored in the memory of the processor 12. However, other techniques of converting ambient light sensed to power output are also possible and contemplated by this disclosure.

In some embodiments, when the ambient light is relatively high, the spotlight 200 may automatically adjust the intensity to be high, whereas when the ambient light is low (or OFF), the intensity may be reduced to conserve power and only provide what is needed. In some embodiments, the light provided may be low (or even OFF) if other ambient sources are providing sufficient light and the intensity increases as the ambient light decreases so that the total amount of light stays at the same level.

Figure 13:
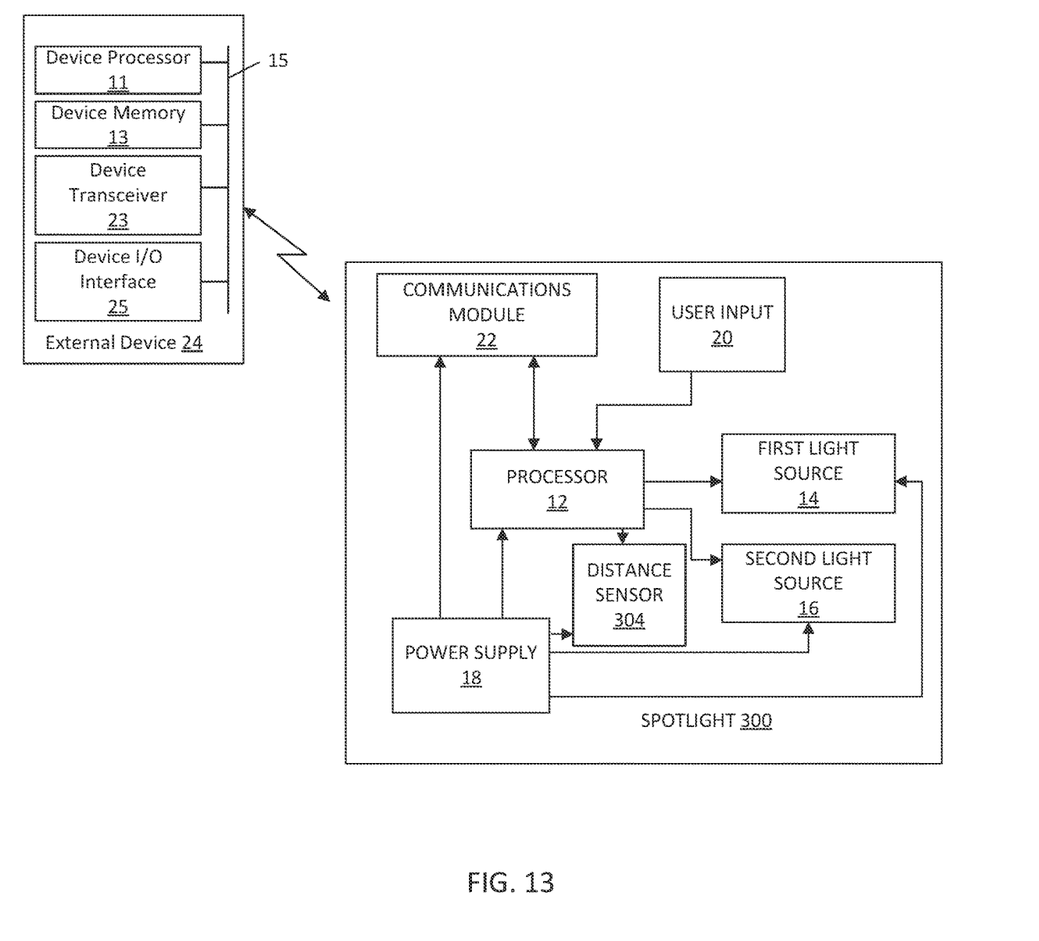
FIG. 13 is a schematic of still another spotlight and an external device embodying the invention.

FIG. 13 illustrates a spotlight, floodlight, or flashlight 300 according to another embodiment of the invention. The spotlight 300 is similar to the spotlight 10 discussed above; however, the illustrated spotlight 300 also includes a distance sensor 304. The distance sensor 304 is coupled to the processor 12 and detects the distance between the spotlight 300 and an object (e.g., whatever object, surface, etc. the spotlight 300 is pointed at). In some embodiments, the distance sensor 304 may be, for example, an ultrasonic sensor, an infra-red sensor, or the like. Based on the detected distance, the processor 12 can adjust the intensity of either or both of the first light source 14 and the second light source 16. Additionally or alternatively, the processor 12 can adjust the distribution between the first light source 14 and the second light source 16 based on the detected distance. For example, the distance sensor 304 may provide an input to the processor 12 indicating the distance between the spotlight 300 and an object. The processor 12 may be pre-configured to convert the input received from the distance sensor 304 to an output power of the first light source 14 and the second light source 16. The processor 12 may convert the distance sensed to a power output using, for example, a look-up table stored in the memory of the processor 12. However, other techniques of converting distance sensed to power output are also possible and contemplated by this disclosure. In some embodiments, when the spotlight 300 is farther from a work area or object, the processor 12 may increase the amount of light provided. Similarly, when the spotlight 300 is closer to the work area or object, the processor 12 may decrease the amount of light provided.

Figure 14:
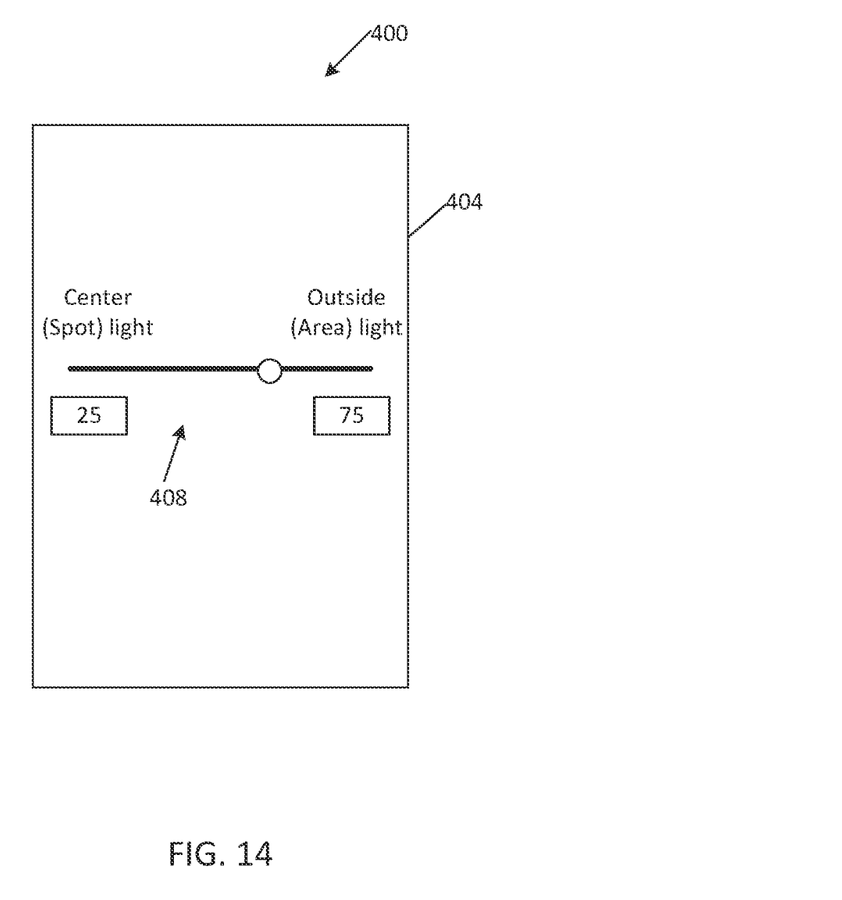
FIG. 14 is a schematic of another external device embodying the invention.

FIG. 14 illustrates another example of an external device 400 for use with the spotlights. The external device 400 includes a user interface 404 (e.g., a screen) presented to the user that allows the user to modify the percentage of power applied to the groups of lights. In the illustrated embodiment, the user interface 404 has a single slider bar 408 (for example, single variable switch) that controls the percentage power distribution between the first light source 14 (e.g., center spotlight) and the second light source 16 (e.g., area lights). That is, the slider bar 408 allows a user to specify the amount of power delivered to the first light source 14 (for example, a first input) and the second light source 16 (for example, a second input) as complementary percentages of a maximum amount of power capable of being provided by the power supply 18. For example, the slider bar 408 allows a user to select X % of power delivered to the first light source 14 and therefore to select (100−X) % of power delivered to the second light source 16.

Thus, the invention provides, among other things, a spotlight configured to be controlled by an external device.

We claim:

1. A spotlight comprising:
   a housing;
   a first light source supported by the housing and including a center spotlight arranged at a center of a light emitting portion of the housing;
   a second light source supported by the housing and including a group of lights arranged adjacent a periphery of the light-emitting portion of the housing and around the center spotlight; and
   a user input for receiving mode selections including a first mode selection, a second mode selection, and a third mode selection.

2. The spotlight of claim 1, wherein the group of lights includes four lights arranged adjacent corners of the light-emitting portion.

3. The spotlight of claim 1, wherein the user input is a switch.

4. The spotlight of claim 1, further comprising a power supply supported by the housing and providing power to the first light source and the second light source.

5. The spotlight of claim 4, wherein the power supply is a Lithium-ion battery pack.

6. The spotlight of claim 1, wherein when the first mode selection is received through the user input, a first amount of power is provided to the first light source and no power is provided to the second light source,
   wherein when the second mode selection is received through the user input, no power is provided to the first light source and a second amount of power is provided to the second light source,
   wherein when the third mode selection is received through the user input, a third amount of power is provided to the first light source and a fourth amount of power is provided to the second light source.

7. The spotlight of claim 1, wherein the center spotlight is configured to cast a narrow beam and the group of lights is configured to cast a broad coverage beam.

8. A spotlight comprising:
   a housing including a light emitting portion;
   a first light source supported by the housing and including a center spotlight arranged at a center of the light emitting portion;
   a second light source supported by the housing and including a group of lights arranged adjacent a periphery of the light-emitting portion, the group of lights including at least four lights each arranged adjacent a corner of the light-emitting portion; and
   a user input for receiving mode selections including a first mode selection, a second mode selection, and a third mode selection.

9. The spotlight of claim 8, further comprising one or more driving circuits configured to drive the first light source and the second light source, wherein the one or more driving circuits is configured to independently operate the first light source and the second light source based on the received mode selections.

10. The spotlight of claim 9, wherein when the first mode selection is received through the user input, the one or more driving circuits provides a first amount of power to the first light source and provides no power to the second light source.

11. The spotlight of claim 10, wherein when the second mode selection is received through the user input, the one or more driving circuits provides no power to the first light source and provides a second amount of power to the second light source.

12. The spotlight of claim 11, wherein when the third mode selection is received through the user input, the one or more driving circuits provides a third amount of power to the first light source and provides a fourth amount of power to the second light source.

13. The spotlight of claim 8, further comprising a power supply supported by the housing and providing power to the first light source and the second light source.

14. The spotlight of claim 13, wherein the power supply is a Lithium-ion battery pack.

15. The spotlight of claim 8, wherein the center spotlight is configured to cast a narrow beam and the group of lights is configured to cast a broad coverage beam.

16. A spotlight comprising:
   a housing configured to support a power supply;
   a first light source supported by the housing and including a center spotlight arranged at a center of a light emitting portion of the housing, the first light source configured to selectively receive power from the power supply;
   a second light source supported by the housing and including a group of lights arranged adjacent a periphery of the light-emitting portion of the housing and around the center spotlight, the second light source configured to selectively receive power from the power supply; and
   one or more driving circuits coupled between the power supply, the first light source, and the second light source and operable to drive the first light source and the second light source.

17. The spotlight of claim 16, further comprising:
   a user input for receiving mode selections including a first mode selection, a second mode selection, and a third mode selection.

18. The spotlight of claim 17, wherein the one or more driving circuits independently operate the first light source and the second light source based on the received mode selections.

19. The spotlight of claim 18, wherein when the first mode selection is received through the user input, the one or more driving circuits provides a first amount of power to the first light source and provides no power to the second light source,
   wherein when the second mode selection is received through the user input, the one or more driving circuits provides no power to the first light source and provides a second amount of power to the second light source,
   wherein when the third mode selection is received through the user input, the one or more driving circuits provides a third amount of power to the first light source and provides a fourth amount of power to the second light source.

20. The spotlight of claim 16, wherein the center spotlight is configured to cast a narrow beam and the group of lights is configured to cast a broad coverage beam.

* * * * *